United States Patent
Yoneda et al.

(10) Patent No.: US 8,426,944 B2
(45) Date of Patent: Apr. 23, 2013

(54) INSULATED GATE BIPOLAR TRANSISTOR

(75) Inventors: Shuji Yoneda, Moriguichi (JP); Kenji Sawamura, Moriguchi (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 49 days.

(21) Appl. No.: 12/732,685

(22) Filed: Mar. 26, 2010

(65) Prior Publication Data

US 2010/0244091 A1  Sep. 30, 2010

(30) Foreign Application Priority Data

Mar. 26, 2009 (JP) ................... 2009-077063

(51) Int. Cl.
*H01L 29/66* (2006.01)
(52) U.S. Cl.
USPC .................................. 257/592; 257/E29.198
(58) Field of Classification Search .............. 257/213, 257/288, 327, 328, 329, 330, 331, 332, 333, 257/334, 565, 578, 579, 580, 581, 582, 583, 257/584, 587, 588, 589, 590, 591, 592, 593
See application file for complete search history.

(56) References Cited

U.S. PATENT DOCUMENTS

| | | | |
|---|---|---|---|
| 3,639,815 A * | 2/1972 | Ernick et al. | 257/586 |
| 4,799,095 A * | 1/1989 | Baliga | 257/153 |
| 5,491,108 A * | 2/1996 | Suzuki et al. | 438/626 |
| 6,376,898 B1 * | 4/2002 | Uda et al. | 257/566 |
| 2008/0277688 A1 * | 11/2008 | Tamada | 257/139 |

FOREIGN PATENT DOCUMENTS

JP  8-167716 A  6/1996

OTHER PUBLICATIONS

Mori et al., "A Novel High-Conductivity IGBT (HiGT) with a Short Circuit Capability," Proceedings of the 10th International Symposium on Power Semiconductor Devices & ICs, 1998, IEEE, p. 429-432.*

* cited by examiner

*Primary Examiner* — Ha Tran T Nguyen
*Assistant Examiner* — Kevin Quinto
(74) *Attorney, Agent, or Firm* — Westerman, Hattori, Daniels & Adrian, LLP

(57) ABSTRACT

In some embodiments, an insulated gate bipolar transistor includes a drift layer, insulation gates formed at a principle surface portion of the drift layer, base regions formed in a between-gate region, an emitter region formed in the base region so as to be adjacent to the insulation gate, an emitter electrode connected to the emitter region, a collector layer formed at the other side of the principle surface portion of the drift layer, and a collector electrode connected to the collector layer. The conductive type base regions are separated with each other by the drift layers, and the drift layer and the emitter electrode are insulated by an interlayer insulation film.

6 Claims, 8 Drawing Sheets

INSULATED GATE BIPOLAR TRANSISTOR

This application claims priority under 35 U.S.C. §119 to Japanese Patent Application No. 2009-77063 filed on Mar. 26, 2009, the entire disclosure of which is incorporated herein by reference in its entirety.

BACKGROUND OF THE INVENTION

1. Field of the Invention

The present invention relates to an insulated gate bipolar transistor (IGBT) for use as, e.g., a switching element in the field of power electronics.

2. Description of the Related Art

The following description sets forth the inventor's knowledge of related art and problems therein and should not be construed as an admission of knowledge in the prior art.

An insulated gate bipolar transistor (IGBT) is noted for high efficiency and fast switching, and used as a switching element in the field of power electronics.

The insulated gate bipolar transistor (IGBT) is classified into a PT (punch-through) structure and a NPT (non punch-through) structure. The punch-through structure includes a collector layer of a semiconductor substrate, and further includes a buffer layer and a drift layer epitaxially grown on the collector layer in this order. When a drift layer is required to have a high voltage resistance characteristic, it is required to have a thickness corresponding to the required high voltage resistance. This in turn increases the production cost due to the thicker epitaxial growth of the drift layer.

On the other hand, in the NPT structure, the drift layer is formed by grinding an FZ (Float Zoning) wafer. Therefore, even in case where a high voltage resistance characteristic is required, an increase in production cost can be suppressed.

In the case of the NPT structure, however, the collector layer is formed by injecting a low dose amount of P+ type impurities in the drift layer, and therefore the amount of holes to be injected into the drift layer from the collector layer becomes lower by several digits as compared with the PT structure. In this case, the discharge amount of the holes from the emitter electrode cannot be neglected.

In order to solve the aforementioned drawbacks, conventionally, several attempts have achieved to control the discharge of holes. For example, Japanese Patent Application Publication H8-167716 discloses the following structure. In the first region between adjacent trenches, the emitter region and the emitter electrode are connected to form a main cell in this region. On the other hand, in the second region between adjacent trenches which is different from the first region, an interlayer insulation film is formed between the emitter region and the emitter electrode to thereby form a dummy cell in this region. Holes are injected into the base layer from the collector side when the IGBT is in an "on" state. However, this structure decreases the area of the main cell, which makes it difficult to discharge holes to the emitter side via the main cell.

As discussed above, in the invention proposed by the aforementioned document, by positively decreasing the area ratio of the main cell, the discharge amount of holes to the emitter side can be controlled to keep the accumulation amount of holes, which enhances the conductivity modulation of the base layer. The aforementioned conventional technique, however, causes decreased current density due to the decreased area ratio of the main cell.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide an insulated gate bipolar transistor capable of enhancing hole accumulation effect while controlling decrease in current density.

Among other potential advantages, some embodiments can provide an insulated gate bipolar transistor comprising:

a first conductive type drift layer;

a plurality of insulation gates formed at a principle surface portion of the drift layer so as to extend in a first direction and arranged in parallel with each other in a second direction perpendicular to the first direction;

a plurality of second conductive type base regions each formed in a between-gate region sandwiched by and between a pair of adjacent insulation gates;

a first conductive type emitter region formed in the base region so as to be adjacent to the insulation gates;

an emitter electrode connected to the emitter region;

a second conductive type collector layer formed at the other side of the principle surface portion of the drift layer; and a collector electrode connected to the collector layer, wherein the plurality of second conductive type base regions are separated with each other in the first direction by the drift layer, and wherein the drift layer and the emitter electrode are insulated.

In some examples, the insulation gate is formed in a trench that is formed from the principle surface portion of the drift layer so as to be deeper than the base region.

In some examples, the drift layer and the emitter electrode are insulated by an interlayer insulation film.

In some examples, the emitter region and the drift layer are separated by the base region.

In some examples, the insulated gate bipolar transistor (IGBT) further includes a high concentration diffusion region in which first conductive type impurity concentration is larger than that of the drift layer is formed between the base region and the drift layer.

In some examples, in the adjacent between-gate regions, the base regions are arranged in a shifted manner in the second direction.

In some examples, the insulated gate bipolar further includes a hole discharge control region formed on a side surface of the base region.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Hereinafter, a preferable embodiment of the present invention will be explained with reference to the attached drawings.

First Embodiment

The structure of an insulated gate bipolar transistor (IGBT) 1A according to a first embodiment of the present invention will be concretely explained with reference to FIGS. 1 to 5. FIGS. 2, 3, 4, and 5 are cross-sectional views taken along the lines A-A', B-B', C-C', and D-D' in FIG. 1, respectively.

Figure 1:
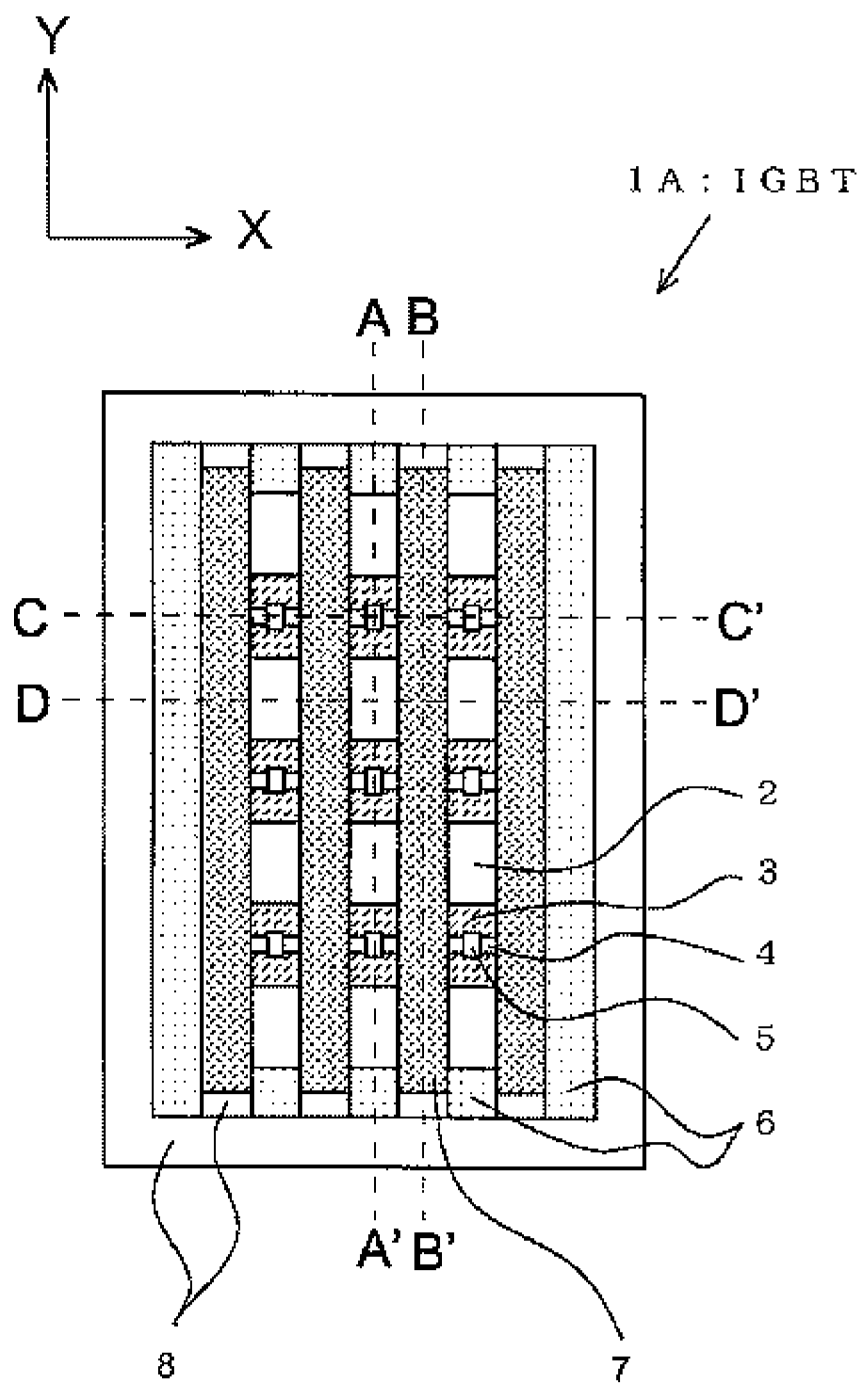
FIG. 1 is a plan view of an insulated gate bipolar transistor (IGBT) according to an embodiment of the present invention.

Referring to FIG. 1, the structure of the insulated gate bipolar transistor (IGBT) according to the first embodiment of the present invention as seen from the top will be explained. This isolated gate bipolar transistor (IGBT) 1A includes a drift layer 2, a base region 3, an emitter region 4, a body region 5, a guard ring 6, a gate electrode 7, and a gate connection line 8. In the actual structure, an emitter electrode 9 connected to the emitter region 4, interlayer insulation films 10 for insulating the emitter electrode 9 from the drift layer 2 or the gate electrode 7 are formed, but these are not illustrated in the plan view for the sake of simplicity.

Hereinafter, each structural element will be detailed. Each gate electrode 7 has a stripe shape extending in the Y-direction in FIG. 1. These gate electrodes 7 are arranged in the X-direction in parallel with each other. The gate electrode 7 is connected to the gate connection line 8 formed around the isolated gate bipolar transistor (IGBT) 1A to be controlled. The p+ type conductive type guard ring 6 is formed in the region surrounded by the gate connection line 8 so as to surround the region except for the gate electrodes 7.

The N− conductive type drift layer 2 is formed between the gate electrodes 7 and 7 and arranged in the region surrounded by the guard ring 6. The P type conductive type base regions 3 are formed in the drift layer 2 so as to be detached from each other.

The N+ conductive type emitter region 4 is formed in each base region 3 so as to be adjacent to the gate electrodes 7. The P+ type body region 5 is formed in each base region 3 so as to be positioned between the emitter regions 4.

Although not illustrated, the emitter electrode 9 is formed so as to cover all of the emitter regions 4. The interlayer insulation film 10 is formed so as to insulate the emitter electrode 9 from the gate electrode 7 and the drift layer 2.

Now, referring to FIG. 2, the cross-sectional structure of the isolated gate bipolar transistor (IGBT) 1A taken along the line A-A' will be explained below. The principal surface portion of the drift layer 2 includes the guard ring 6, the base regions 3, and the body regions 5. On the principal surface portion of the drift layer 2, the emitter electrode 9, the interlayer insulation films 10 and the gate connection line 8 are arranged. On the other hand, at the rear surface of the drift layer 2, the collector layer 11 and the collector electrode 12 are arranged.

The structure of the principal surface portion of the drift layer 2 will be detailed. The guard ring 6 is formed deeper than the base region 3 at the periphery of the insulated gate bipolar transistor (IGBT) 1A. The base regions 3 are formed so as to be detached from each other in the region surrounded by the guard ring 6. The body region 5 is formed in the surface portion of the base region 3 so as to be positioned at the center of the base region 3. Note that the gate electrode 7 is arranged so as not to be formed in this cross-section.

The structure of the above portion of the principal surface portion of the drift layer 2 will be detailed. The emitter electrode 9 is formed to have a wide width and area capable of covering all of the emitter regions 4. The interlayer insulation film 10 is formed so that the emitter electrode 9 and the emitter region 4 are connected and that the emitter electrode 9 and the drift layer 2 are insulated. The gate connection line 8 is formed so that the upper and lower side thereof are sandwiched by and between the interlayer insulation films 10 at the periphery of the insulated gate bipolar transistor (IGBT) 1A.

The rear surface side of the drift layer 2 will be detailed. The P+ conductive type collector layer 11 is formed by injecting ion into the entire rear surface of the drift layer 2. The collector electrode 12 is formed in close contact with the collector layer 11.

Figure 3:
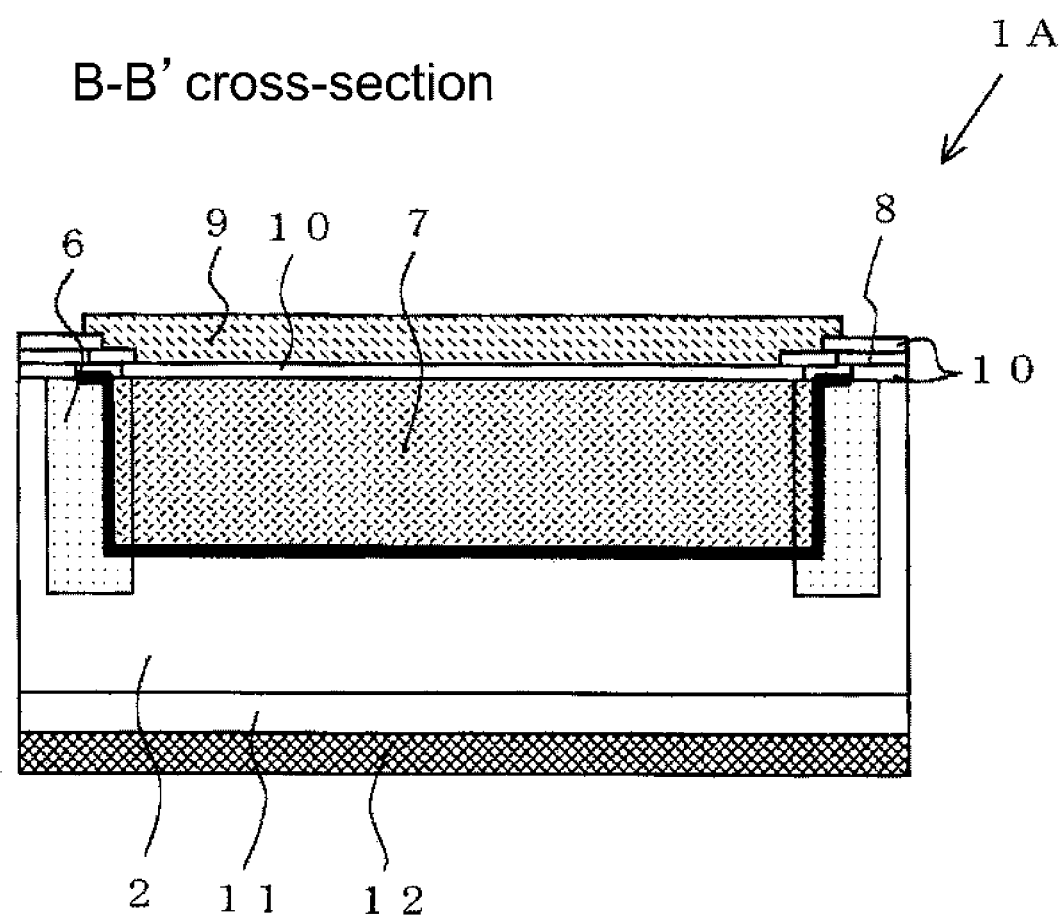
FIG. 3 is a cross-sectional view of the insulated gate bipolar transistor (IGBT) taken along the line B-B' in FIG. 1.

Next, referring to FIG. 3 showing the cross-sectional view taken along the line B-B' in FIG. 1, the cross-sectional structure of the insulated gate bipolar transistor (IGBT) 1A will be explained.

In this cross-section, the base region 3, the emitter region 4, and the body region 5 are not formed. The gate electrode 7 is formed so that one end of the gate electrode and the other end thereof are connected to the gate connection line 8. Thus, the gate electrode 7 is controlled depending on the signal from the gate connection line 8. The interlayer insulation film 10 is formed to have a wide width so that the emitter electrode 9 and the gate electrode 7 are insulated.

The most of the remaining structure is the same as that of the cross-sectional structure taken along the line A-A', and therefore the explanation will be omitted.

Figure 4:
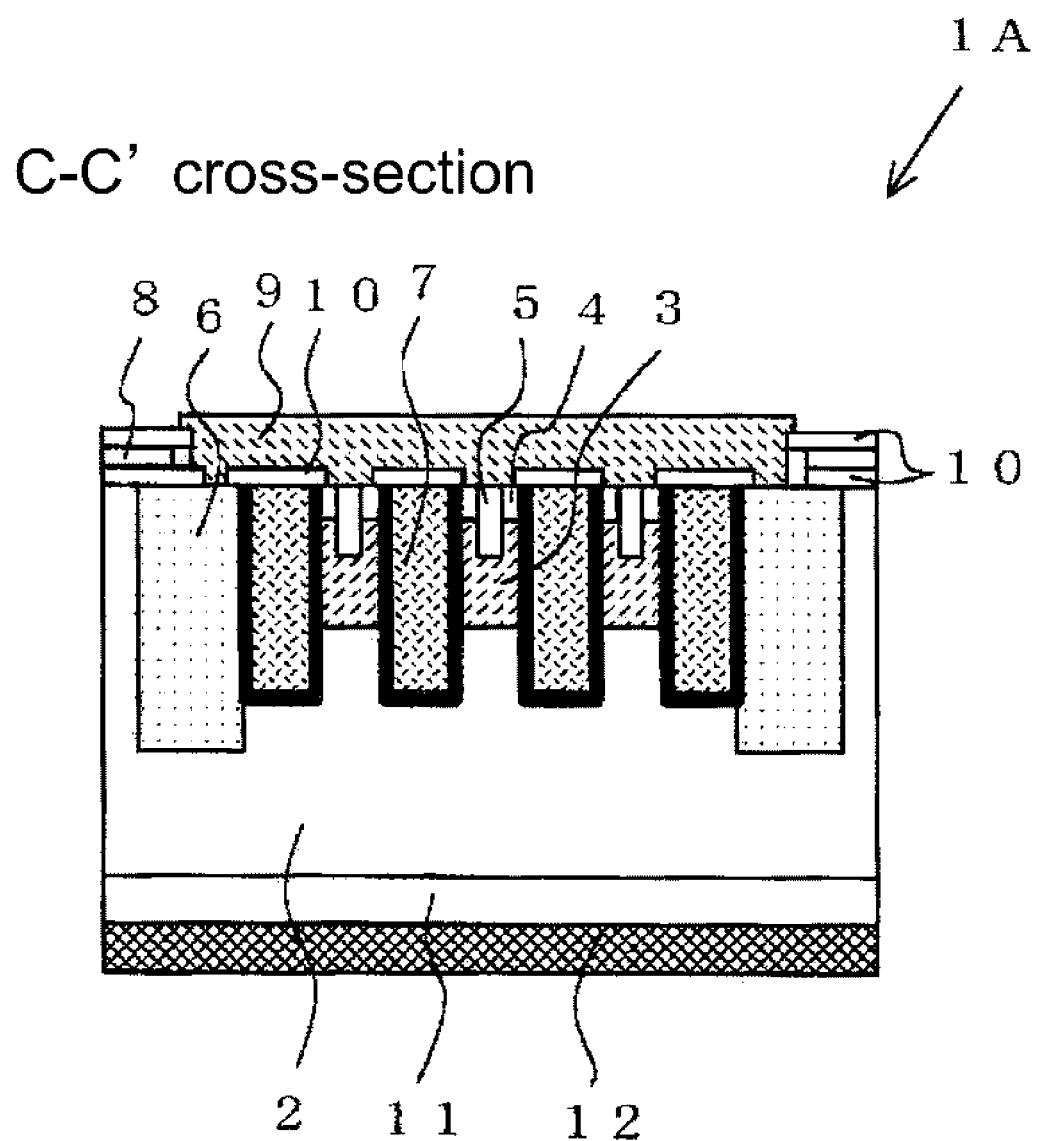
FIG. 4 is a cross-sectional view of the insulated gate bipolar transistor (IGBT) taken along the line C-C' in FIG. 1.

Next, referring to FIG. 4 showing the cross-sectional view taken along the line C-C' in FIG. 1, the cross-sectional structure of the insulated gate bipolar transistor (IGBT) 1A will be explained.

In this cross-section, at the principal surface portion of the drift layer 2 surrounded by the guard ring 6, a plurality of gate electrodes 7 are formed so as to be detached with each other. In each region between the adjacent gate electrodes 7, the base region 3 is formed in a state in which the lower end of the base region 3 is located at a position shallower than the lower end of the gate electrode 7. In each base region 3, the emitter region 4 is formed so as to be adjacent to the gate electrode 7, and the body region 5 is formed to be positioned between the emitter regions 4.

On the principal surface portion of the drift layer 2, the emitter electrode 9 is formed to have a wide width capable of connecting to all of the emitter regions 4. The interlayer insulation films 10 are formed so that the emitter electrode 9 and the emitter regions 4 are connected and that the emitter electrode 9 and the gate electrodes 7 are insulated.

Since the other structure is the same as mentioned above, the cumulative explanation will be omitted.

Figure 5:
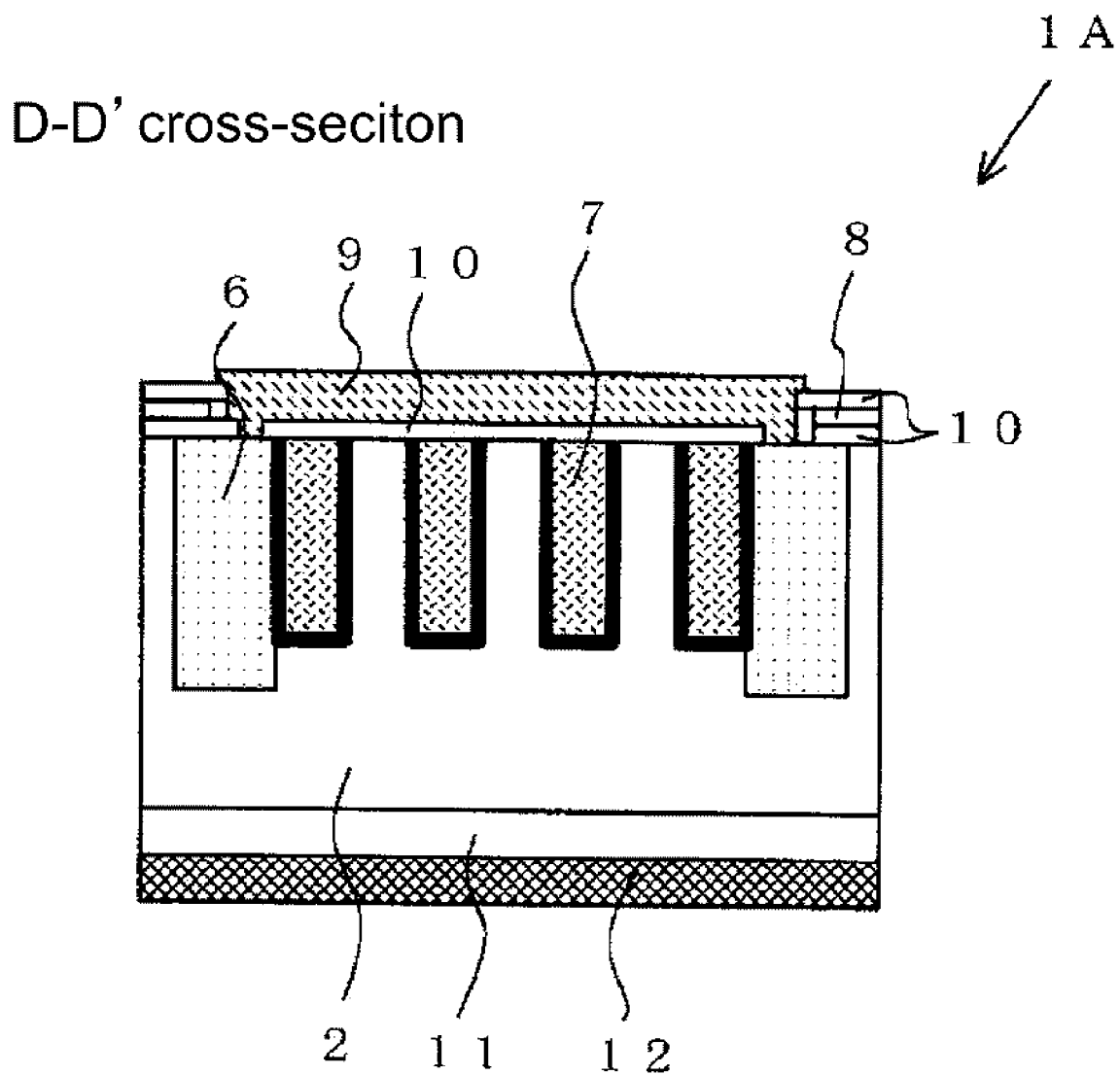
FIG. 5 is a cross-sectional view of the insulated gate bipolar transistor (IGBT) taken along the line D-D' in FIG. 1.

Next, referring to FIG. 5 showing the cross-sectional view taken along the line D-D' in FIG. 1, the cross-sectional structure of the insulated gate bipolar transistor (IGBT) 1A will be explained.

The structure of the principle surface portion of the drift layer 2 will be detailed. In this cross-section, in the same manner as in the cross-sectional view taken along the line C-C', in the principle surface portion of the drift layer 2 surrounded by the guard ring 6, the plurality of gate electrodes 7 are formed in a detached manner. In each area between the adjacent gates 7, however, the base region 3, the emitter region 4 and the body region 5 are not formed.

In the structure of the principle surface portion of the drift layer 2, the interlayer insulation films 10 are formed along the entire surface of the principle surface portion so that the emitter electrode 9 is not connected to the gate electrode 7 and the drift layer 2.

Since the other structure is the same as mentioned above, the cumulative explanation will be omitted.

Now, the functions of the aforementioned structure will be explained below.

When the insulated gate bipolar transistor (IGBT) 1A is in an "on" state, i.e., when a positive electric potential is impressed to the collector electrode 12 in a state in which the emitter electrode 9 is grounded, the PN junction of the drift layer 2 and the base region 3 is inversely biased. In this state, when a positive electric potential equal to or exceeding a threshold value between the gate electrode 7 and the emitter electrode 9 is applied to the gate electrode 7, in the C-C' cross-section (FIG. 4), a channel inverted into an N conductive type is formed in the drift region 2 along the gate electrode 7. This causes injection of electrons into the drift layer 2 from the emitter region 4 via the channel. As a result, holes are injected into the drift layer 2 from the collector layer 11, causing conductivity modulation in the drift layer 2, which decreases the resistance of the drift layer 2.

At this time, in this embodiment, the holes are hardly discharged from the emitter electrode 9, and therefore the conductivity modulation is excellent. In detail, referring to the A-A' cross-section (FIG. 2), since the interlayer insulation films 10 are formed from between the emitter electrode 9 and the drift layer 2, no hole will be discharged between the base regions 3. This is confirmed from the D-D' cross-section (FIG. 5) that no discharge pathway for holes exists in this cross-section.

In this embodiment, there also is an advantage that a decrease in current density can be controlled. In detail, referring to the C-C' cross-section (FIG. 4), it shows that a current pathway is formed in the region between the gate electrodes 7 in this cross-section. However, referring to the D-D' cross-section (FIG. 5) since no current pathway is formed in the region between the gate electrodes 7, it may be considered that there is a concern that the current density may decrease as a whole of the insulated gate bipolar transistor (IGBT) 1A. However, referring to the A-A' cross-section (FIG. 2), it is confirmed that not only the lower surface of the base region 3 but also the side surfaces of the base region 3 face the drift layer 2. Therefore, the current pathway is formed not only on the lower surface of the base region 3 but also on the side surfaces of the base region 3. Holes will be accumulated not only on the lower surface of the base region 3 but also on the side surface of the base region 3. Therefore, the current pathway formed on the side surfaces of the base region 3 also decreases in resistance value. As will be understood from the above, in this embodiment, since the low resistance current pathway also is formed on the side surfaces of the base region 3, a decrease in current density can be controlled.

Figure 2:
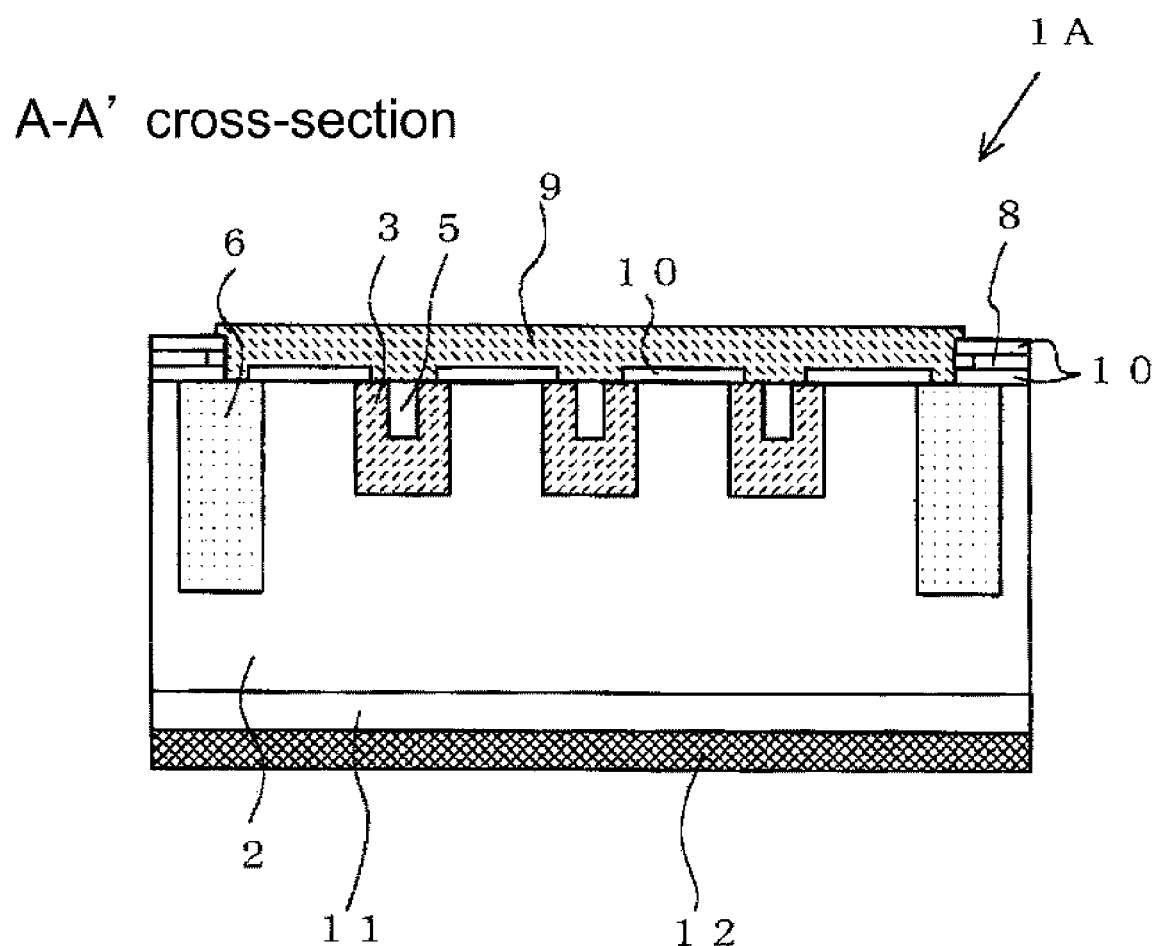
FIG. 2 is a cross-sectional view of the insulated gate bipolar transistor (IGBT) taken along the line A-A' in FIG. 1.

Only considering the controlling of hole discharge, when referring to the A-A' cross-section (FIG. 2), it may be considered that the base region 3 can be formed so as to extend from the left side guard ring 6 to the right side guard ring 6 provided that the configuration of the interlayer insulation film 10 is kept as shown in FIG. 2. In such a case, however, the base region 3 is formed entirely. Therefore, even if holes are entered from the base region 3 immediately below the interlayer insulation layer 10, the holes will be discharged from the position where no interlayer insulation layer 10 is formed to the emitter electrode 9 since the holes can also be moved in the right and left direction in the base region 3. To the contrary, in this embodiment, no pathway for discharging holes exists at the positions where the interlayer insulation films 10 are formed, and therefore holes will be accumulated in a preferable manner.

Second Embodiment

Next, with referring to FIG. 6, an insulated gate bipolar transistor (IGBT) 1B according to a second embodiment of the present invention will be explained. This insulated gate bipolar transistor (IGBT) 1B has been further enhanced in hole accumulation effect than the aforementioned insulated gate bipolar transistor (IGBT) 1A of the first embodiment.

Figure 6:
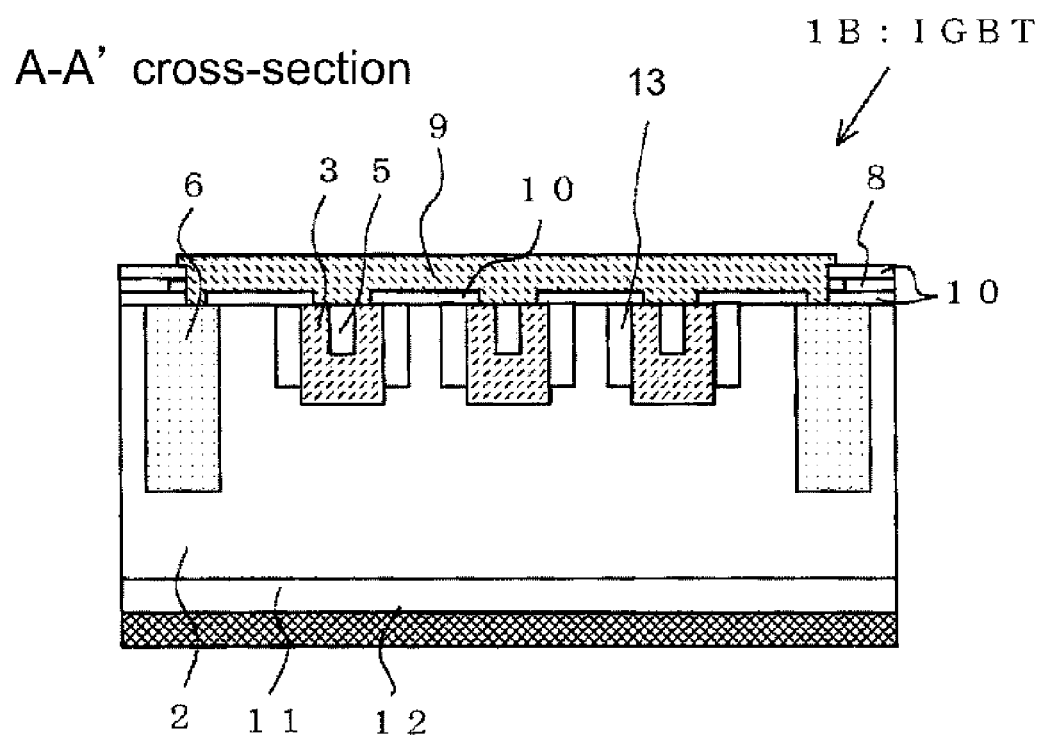
FIG. 6 is a cross-sectional view of the insulated gate bipolar transistor (IGBT) according to a second embodiment of the present invention, wherein FIG. 6 corresponds to FIG. 1.

FIG. 6 shows a cross-sectional structure of the insulated gate bipolar transistor (IGBT) 1B of this second embodiment which corresponds to the A-A' cross-section (FIG. 2) of the insulated gate bipolar transistor (IGBT) 1A of the first embodiment.

Comparing to the first embodiment, in the insulated gate bipolar transistor (IGBT) 1B of this embodiment, an N type conductive type hole discharge control regions 13 are formed on the side surfaces of the base regions 3. Since the other structure is the same as mentioned above, the cumulative explanation will be omitted.

The function of this structure will be explained. When referring to the A-A' cross-section (FIG. 2) of the insulated gate bipolar transistor (IGBT) 1A of the first embodiment, in this insulated gate bipolar transistor (IGBT) 1A, it is understood that holes will be accumulated below the interlayer insulation films 10 between the adjacent base regions 3. However, the side surface of the base region 3 is exposed to the drift layer 2, and therefore it may be considered that holes will be discharged from the side surface to the emitter electrode 9. To the contrary, in the insulated gate bipolar transistor (IGBT) 1B of this embodiment, since the hole discharge control regions 13 are formed on the side surfaces of the base regions 3, holes will be hardly discharged from the side surfaces of the base regions 3. For this reason, in the insulated gate bipolar transistor (IGBT) 1B of this second embodiment, hole accumulation effect will be further enhanced as compared to the insulated gate bipolar transistor (IGBT) 1A of the first embodiment.

Third Embodiment

Figure 7:
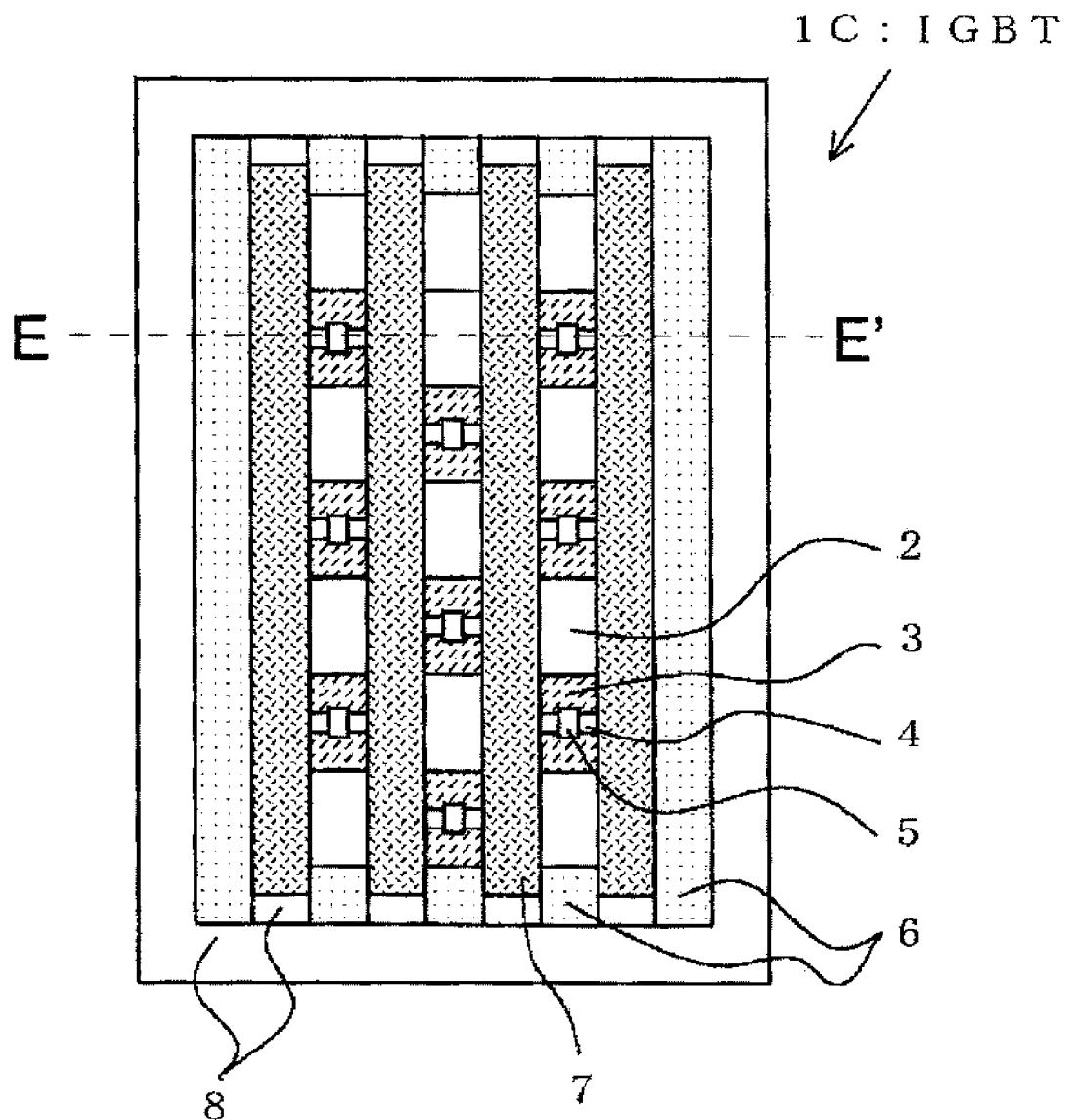
FIG. 7 is a plan view of an insulated gate bipolar transistor (IGBT) according to a third embodiment of the present invention.
Figure 8:
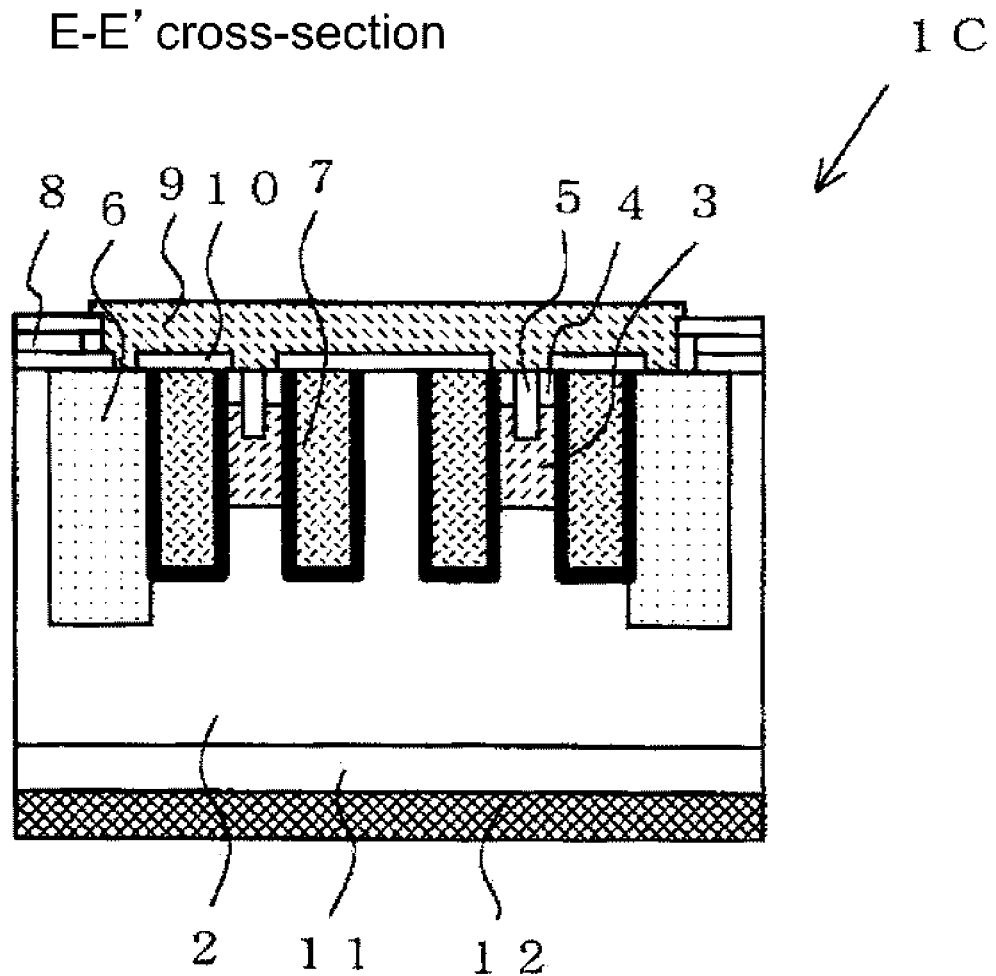
FIG. 8 is a cross-sectional view of the insulated gate bipolar transistor (IGBT) taken along the line E-E' in FIG. 7.

Next, an insulated gate bipolar transistor (IGBT) 1C of a third embodiment of the present invention will be explained with referring to FIGS. 7 and 8. FIG. 7 is a plan view of the insulated gate bipolar transistor (IGBT) 1C of this embodiment, and FIG. 8 is a cross-sectional view taken along the line E-E' in FIG. 7.

In this insulated gate bipolar transistor (IGBT) 1C, the base regions 3 are arranged so as to shift with each other in the region between the adjacent gate electrodes 7. At the portion where the base region 3 is formed in the region between the adjacent gate electrodes 7, a current pathway is formed and holes are discharged. On the other hand, at the portion where the base region is not formed in the region between the adjacent gate electrodes 7, an interlayer insulation film 10 is formed between the emitter electrode 9 and the drift layer 2. Therefore, the discharge of holes is controlled. With this structure, in the insulated gate bipolar transistor (IGBT) 1C, the current density distribution as seen from the top can be equalized as compared with the insulated gate bipolar transistor (IGBT) 1A of the first embodiment.

The present invention has been explained by way of the first to third embodiments. Note that in the present invention a plurality of base regions 3 are formed so as to be detached from each other in the region between the adjacent gate electrodes 7. In the area between the adjacent base regions 3, an interlayer insulation film 10 is formed between the emitter electrode 9 and the drift layer 2. With this structure, holes are not discharged from between the base regions 3 and therefore holes will be easily accumulated therebetween. Furthermore, since the side surface of the base region 3 is exposed, a current pathway is formed on the side surfaces of the base regions 3, which controls decrease in current density.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

For example, the present invention is not limited to be applied to the aforementioned conductive type shown in the aforementioned embodiments, and can also be applied to a reverse conductive type.

Furthermore, in the aforementioned embodiments, the gate connection line 8 is arranged outside the guard ring 9. The present invention, however, is not limited to this, and the arrangement of the gate connection line can be arbitrarily changed.

Furthermore, in the aforementioned embodiments, on the rear surface side of the drift layer 2, only the collector layer 11 and the collector electrode 12 are formed. The present invention, however, is not limited to this. For example, it can be configured such that an N+ conductive type buffer layer can be formed between the drift layer 2 and the collector layer 11.

What is claimed is:

1. An insulated gate bipolar transistor comprising:
   a first conductive type drift layer;
   a plurality of gate electrodes formed at a principle surface portion of the drift layer so as to extend in a first direction and arranged in parallel with each other in a second direction perpendicular to the first direction;
   a plurality of second conductive type base regions each formed in a between-gate region sandwiched by and between a pair of adjacent gate electrodes;
   a first conductive type emitter region formed in the base region so as to be adjacent to the gate electrodes;
   an emitter electrode connected to the emitter region;
   a second conductive type collector layer formed at the other side of the principle surface portion of the drift layer;
   a collector electrode connected to the collector layer,
   an interlayer insulation film which is located over and covers the gate electrode; and
   a hole discharge control region formed only on a side surface of the base region in the second direction,
   wherein the plurality of second conductive type base regions are separated with each other in the first direction by the drift layer, and
   wherein the drift layer and the emitter electrode are insulated by the interlayer insulation film.

2. The insulated gate bipolar transistor as recited in claim 1, wherein the gate electrodes is formed in a trench that is formed from the principle surface portion of the drift layer so as to be deeper than the base region.

3. The insulated gate bipolar transistor as recited in claim 1, wherein the emitter region and the drift layer are separated by the base region.

4. The insulated gate bipolar transistor as recited in claim 1, wherein in the adjacent between-gate regions, the base regions are arranged in a shifted manner in the second direction.

5. The insulated gate bipolar transistor as recited in claim 1, further comprising:
   a body region which separates the emitter region into two emitter regions.

6. The insulated gate bipolar transistor as recited in claim 1, wherein the interlayer insulation film is located directly over the gate electrode and extends beyond the gate electrode.

* * * * *